United States Patent [19]

Baer et al.

[11] Patent Number: 4,888,986
[45] Date of Patent: Dec. 26, 1989

[54] ROTATIONAL POSITION INDICATOR

[75] Inventors: John S. Baer, Bar Harbor; Michael A. Vietti, Swans Island, both of Me.

[73] Assignee: RainWise, Inc., Bar Harbor, Me.

[21] Appl. No.: 322,620

[22] Filed: Mar. 13, 1989

[51] Int. Cl.⁴ ................... G01P 13/02; H03M 1/00
[52] U.S. Cl. ............................. 73/188; 335/206; 335/207; 341/15
[58] Field of Search ............ 73/170 R, 188; 335/206, 335/207, 159, 180, 181; 341/15, 16, 17, 183, 192

[56] References Cited

U.S. PATENT DOCUMENTS

| | | |
|---|---|---|
| 2,656,106 | 10/1953 | Stabler . |
| 3,122,735 | 2/1964 | Townsend . |
| 3,123,818 | 3/1964 | Steele . |
| 3,268,887 | 8/1966 | Sullivan . |
| 3,364,740 | 1/1968 | Wong ................................ 73/188 |
| 3,371,336 | 2/1968 | Bennett et al. .................... 341/15 |
| 3,381,288 | 4/1968 | Van Vlodrop . |
| 3,434,136 | 3/1969 | Hawley et al. . |
| 3,549,897 | 12/1970 | Blake . |
| 4,041,483 | 8/1977 | Groff . |
| 4,086,580 | 4/1978 | Schroeder . |
| 4,287,762 | 9/1981 | Baer .............................. 73/170 R |
| 4,422,328 | 12/1983 | Luchess et al. . |
| 4,544,913 | 10/1985 | Van Buren et al. . |
| 4,627,277 | 12/1986 | Baer . |
| 4,667,514 | 5/1987 | Baer . |

Primary Examiner—Charles A. Ruehl
Attorney, Agent, or Firm—Daniel H. Kane, Jr.

[57] ABSTRACT

A rotational position indicator useful for example for indicating wind direction is provided by a stator having nine position sensors substantially equally spaced around the circumference of a circle and an armature mounted for rotation on an axis located at the center of the circle. The armature is formed with two position sensor actuators mounted at approximately 140° relative to each other. Each position sensor actuator is mounted at a radial position for selectively actuating the position sensors upon rotation of the armature. An electric circuit is coupled to each position sensor for indicating actuation or not of the respective position sensor. The output provides a unique position code for successive intervals of angular positioning of the armature relative to the stator. The actuators have an actuating effect over a selected angular interval sufficient to produce 36 unique position codes for indentifying successive 10° intervals of angular positioning of the armature relative to the stator.

20 Claims, 4 Drawing Sheets

ROTATIONAL POSITION INDICATOR

TECHNICAL FIELD

This invention relates to a new rotational position indicator useful for example for indicating wind direction or more generally for indicating the rotational position of a shaft. More specifically the invention provides an absolute rotational position indicator that generates 36 unique position codes for identifying successive 10° intervals of absolute angular positioning of a weather vane shaft or other rotating shaft.

BACKGROUND ART

U.S. Pat. No. 4,287,762 describes a digital electronic weather station or weather monitor with digital display and circuitry for selecting and displaying any of a number of monitored weather functions such as indoor and outdoor temperatures, pressure, rainfall, humidity, wind speed and wind direction. The weather parameters are monitored by various transducers coupled to the weather center circuitry. The transducers generally utilize the rotational motion or other displacement of a respective parameter responsive structure and incorporate visible calibration marks for example in a digital code pattern to be read by a stationary optical reader or photo detector which provides electrical output signals for processing. The optical reading techniques used in U.S. Pat. No. 4,287,762 generally transform analog devices typically employing as the moveable analog element a rotatable shaft into digital read out devices and are applicable not only to weather transducers but to condition sensing instruments generally.

The Schroeder U.S. Pat. No. 4,086,580 describes another relative rotational position shaft encoder or incremental encoder which provides a series of discrete output signals as a function of rotation. Attached to the shaft is a disk with solid portions and slots. A light source and a pair of light detectors generate a first signal related to the amount of rotation and a second signal dependent upon the direction of rotation. The determination of rotational position is dependent upon an original reference position or initial zero position and is subject to cumulative error. Another such incremental optical shaft encoder is described in the Stabler U.S. Pat. No. 2,656,106. A magnetic rotational position sensing apparatus is described in the Sullivan U.S. Pat. No. 3,268,887.

The problems associated with incremental or relative rotational position shaft encoders may be overcome by providing absolute rotational position encoders for example as described in the Blake U.S. Pat. No. 3,549,897. Such an absolute electro-optical encoder however requires complex reticle tracks on a rotary disk. A hybrid shaft position encoder is described in the Groff U.S. Pat. No. 4,041,483 but requires multiple engaging disks with coded tracks. A variety of other rotary switches and shaft encoders is described in the prior art.

OBJECTS OF THE INVENTION

It is an object of the present invention to provide a simplified absolute rotational position indicator which provides unique position codes for identifying successive intervals of angular positioning of a shaft or other armature relative to a stator or stationary reference.

More specifically it is an object of the invention to provide a unique geometry of position sensors and position sensor actuators which produces 36 unique position codes for identifying successive 10° intervals of relative angular positioning between the position sensors and actuators.

Another object of the invention is to provide such a simplified absolute rotational position indicator applicable for use with weather vane shafts for generating unique position codes which may be processed by a digital electronic weather center or weather monitor for displaying wind direction.

DISCLOSURE OF THE INVENTION

In order to accomplish these results the present invention provides a new rotational position indicator with a stator or stationary reference having nine position sensors substantially equally spaced around the circumference of a circle. An armature is mounted for rotation on an axis located at the center of the circle. According to the invention the armature is formed with two position sensor actuators mounted at approximately 140° relative to each other.

Each position sensor actuator is mounted at a radial position for selectively actuating the position sensors upon rotation of the armature. An electric circuit is coupled to each position sensor for indicating actuation or not of the respective position sensor providing the unique position codes for successive intervals of angular positioning of the armature relative to the stator.

In the preferred example embodiment the actuators are constructed and arranged to have an actuating effect on the position sensors over a selected angular interval which produces 36 unique position codes for identifying successive 10° intervals of angular positioning of the armature relative to the stator. To achieve this result the geometry of the actuator is arranged so that the actuating effect on position sensors extends over an angular interval selected to be at least as great as the angular spacing between two adjacent position sensors.

A feature and advantage of the present invention is that the novel geometry of the stator or stationary reference of position sensors and the armature assures unique and absolute encoding for each 10° interval of angular positioning around the circle. While the circle may be of varying diameter, the equal spacing between position sensors is an equal spacing of approximately 40°. In the preferred example embodiment the actuators are constructed and arranged to have an actuating effect on position sensors over an angular interval selected to be within a range of at least as great as 40° and less than 60°.

With magnets as actuators, the magnet geometry is selected to provide fringing magnetic fields having an actuating effect over a selected angular interval within the preferred angular interval range. With magnetic actuators, magnetic read switches or Hall effect switches may be used for the position sensors. Optical or electrical sensors and actuators may also be used, arranged according to the geometry of the invention.

The electrical circuit may include a parallel to serial shift register operatively coupled with nine parallel inputs from the nine position sensors and a data line output for delivering unique position codes in a serial stream of bits. The microprocessor of a weather center processes the unique position codes for displaying the angular position for example of a weather vane shaft corresponding to wind direction.

A variety of alternative embodiments and arrangements are contemplated by the invention. For example the position reference sensors may rotate while the actuators in the unique angular relationship according to the invention may be stationary. Other arrangements for relative rotation may be used. Furthermore the geometry and actuating range of the actuators may be varied generating other unique position codes for the position intervals.

Other objects, features, and advantages of the invention are set forth in the following specification and accompanying drawings.

DESCRIPTION OF PREFERRED EXAMPLE EMBODIMENTS & BEST MODE OF THE INVENTION

Figure 1:
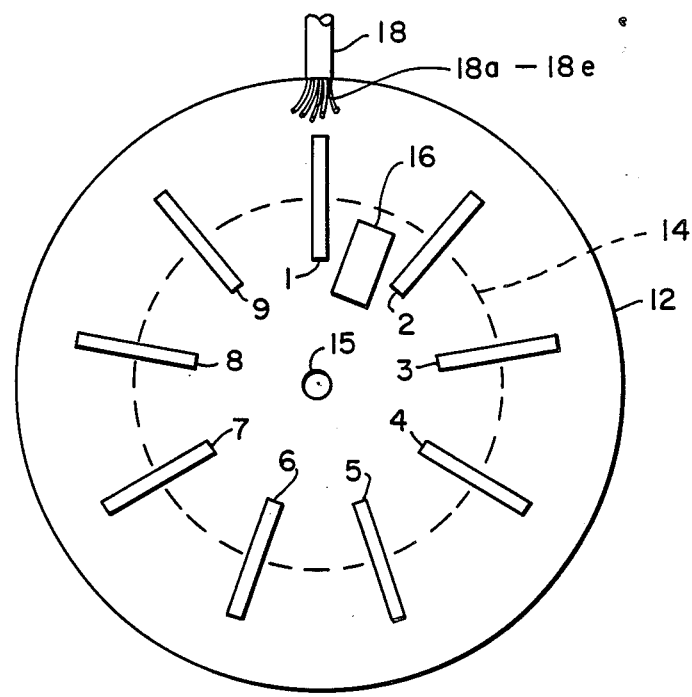
FIG. 1 is a diagrammatic plan view of the stator or stationary reference and position sensors arranged according to the present invention.

The stationary position reference or "stator" for a rotational position indicator according to the present invention is illustrated in FIG. 1. A stationary base 12 is provided on which is mounted nine magnetically actuated reed switches 1-9 which function as the position sensors. The reed switch position sensors 1-9 are mounted on the base or circuit board 12 equally spaced around the circumference of an imaginary circle 14. The reed switches 1-9 are oriented with the elongate dimension of the reed switches in the radial direction equally spaced from the center axis 15 of the imaginary circle 14.

The base 12 may function as a circuit board or incorporate a printed circuit board with the nine leads from reed switches 1-9 coupled to the parallel inputs of the parallel to serial shift register 16 mounted on the base 12. The shift register 16 is in turn coupled through leads 18a-18e through cable 18 for example to a microprocessor as hereafter described.

Figure 2:
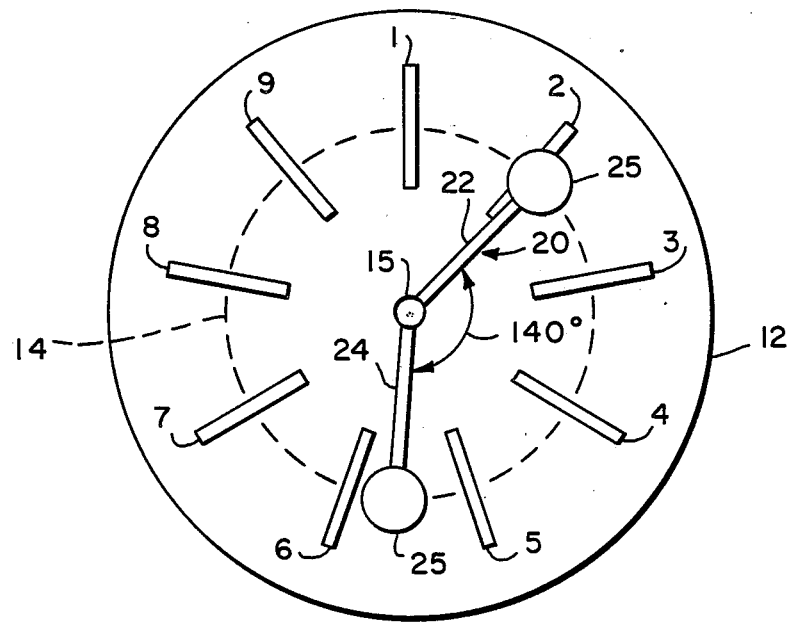
FIG. 2 is a diagrammatic plan view of the stationary reference and position sensors with an armature mounted for rotation over the position sensors on an axis located at the center of the circle of position sensors.

A shaft whose rotational position is to be determined and indicated, for example a weather vane shaft, is positioned at the axis 15 at the center of the imaginary circle 14. The moving element, armature or actuator assembly 20 is mounted for rotation on the axis 15 for example as shown in FIG. 2. The moving element or armature 20 may be mounted directly on a shaft who's rotational position is to be established or on a rotating axial element coupled to the shaft.

In the example of FIG. 2 the rotating armature 20 is constructed with two radial arms 22 and 24 that are fixed relative to each other at an angle of 140°. A small variation on either side of 140° of no more than a few degrees may be tolerated according to the other dimensions and parameters of the system as hereafter described but the unique geometry and position coding according to the present invention requires the angular relationship between the radial arms 22 and 24 of approximately 140° and preferably 140°. This unique geometrical configuration according to the invention produces a unique position code from the shift register 16 for each 10° interval of rotational position of the moving element or armature 20 relative to the position reference base 12 as hereafter analyzed in further detail.

Mounted on each radial armors a position sensor actuator 25, in this example a button magnet, a magnet in the configuration of a small cylinder approximately ½ inch (1.3 cm) in diameter and ¼ inch (0.6 cm) in thickness.

Typical dimensions for the rotational position indicator components may be as follows. The circuit board base 12 is a disk for example 5 inches (12.7 cm) in diameter. The reed switches 1-9 are mounted with the mid points of the elongate dimension of the reed switches lying equally spaced around the circumference of an imaginary circle for example 2½ inches to 3 inches (6.3-7.6 cm) in diameter. In the illustrated example of a three inch diameter circle, the circumference is approximately 9.4 inches (24 cm). The 40° equal angular spacing between the reed switches therefore results in a spacing between mid points of the reed switches at the circumference of approximately 1.05 inches (2.6 cm).

Figure 3:
FIG. 3 is a diagrammatic side view of a magnetic actuator showing the fringing fields and range of actuating effect.

In this dimensional context, a magnet actuator of the dimensions illustrated in FIG. 3 is preferred. The magnetization of the button magnet is oriented with the north south poles lying along the axis of the small cylinder. The fringing fields extending from the magnet actuator result in an effective actuating dimension of approximately 1¼ inches (3.2 cm) in width or diameter with respect to the reed switches mounted on the stationary reference base or stator 12. The effective actuating width of the actuator 25 is therefore slightly greater than the circumferential spacing between the reed switch centers.

In terms of angular spacing the reed switches or other position sensors are spaced approximately 40° apart around the circle and the effective angular actuating width or diameter of each of the two actuators must be at least equal to or greater than 40°. In this example the effective actuating annular width or diameter of the actuators is approximately 50°. By this selected dimension each actuator may actuate two adjacent reed switches at a time in some positions, and only one reed switch at a time in other rotational positions. The result is a unique position code for each 10° interval in which either two or three unique combination of reed switches or other position sensors are actuated for each 10° interval.

While spacial coordinate dimensions may vary, the angular dimensions establish the unique geometry according to the invention. Thus, the nine position sensors should be spaced at approximately 40° intervals around the circumference of the circle of selected dimension. The actuating width or diameter of the actuator must be at least as great as the angular spacing of adjacent position sensors that is ≧40°. The preferred range of effective actuating width for the actuator is from ≧40° to <60°. Within this range the armature will actuate a unique combination of either two or three of the nine lead switches for each 10° interval of the circle as can be verified with reference to the 10° interval compass rose of FIG. 4.

Figure 4:
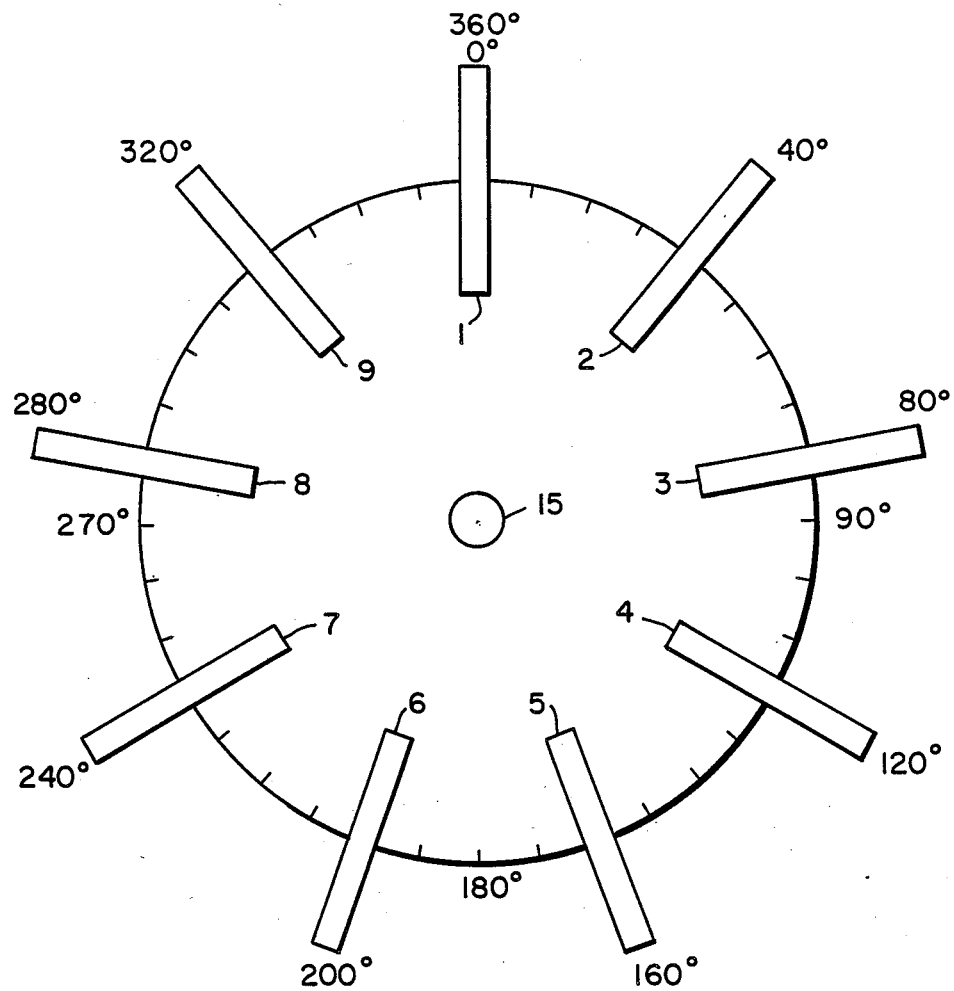
FIG. 4 is an enlarged diagrammatic plan view of the circle of position sensors for demonstrating the unique angular interval position encoding achieved by the two actuators at approximately 140° relative to each other according to the selected range of actuating effect of the actuators.

The code may be determined and verified by placing two circles on the compass rose of FIG. 4, each for example with an angular width or diameter of 50°, at two locations on radial arms fixed at 140° relative to each other. In each instance a unique position code is generated as set forth in Table I. For each 10° angular interval of positioning of the first actuator, Table I indicates which combination of reed switches is actuated along with the corresponding binary "on/off" code that is input in parallel to the shift register and output in serial from the shift register.

TABLE I

| 10° Degree Interval | Actuated Reed Switches | Unique Serial Position Code |
| --- | --- | --- |
| 0°/360° | 1,4,5 | 100110000 |
| 10° | 1,5 | 100010000 |
| 20° | 1,2,5 | 110010000 |
| 30° | 2,5 | 010010000 |
| 40° | 2,5,6 | 010110000 |
| 50° | 2,6 | 010001000 |
| 60° | 2,3,6 | 011001000 |
| 70° | 3,6 | 001001000 |
| 80° | 3,6,7 | 001001100 |
| 90° | 3,7 | 001000100 |
| 100° | 3,4,7 | 001100100 |
| 110° | 4,7 | 000100100 |
| 120° | 4,7,8 | 000100110 |
| 130° | 4,8 | 000100010 |
| 140° | 4,5,8 | 000110010 |
| 150° | 5,8 | 000010010 |
| 160° | 5,8,9 | 000010011 |
| 170° | 5,9 | 000010001 |
| 180° | 5,6,9 | 000011001 |
| 190° | 6,9 | 000001001 |
| 200° | 1,6,9 | 100001001 |
| 210° | 1,6 | 100001000 |
| 220° | 1,6,7 | 100001100 |
| 230° | 1,7 | 100000100 |
| 240° | 1,2,7 | 110000100 |
| 250° | 2,7 | 010000100 |
| 260° | 2,7,8 | 010000110 |
| 270° | 2,8 | 010000010 |
| 280° | 2,3,8 | 011000010 |
| 290° | 3,8 | 001000010 |
| 300° | 3,8,9 | 001000011 |
| 310° | 3,9 | 001000001 |
| 320° | 3,4,9 | 001100001 |
| 330° | 4,9 | 000100001 |
| 340° | 1,4,9 | 100100001 |
| 350° | 1,4 | 100100000 |

Reference to FIG. 4 also indicates that actuators of larger effective actuating angular width or diameter may be used for generating other unique 10° interval codes. For example in the range of effective actuator angular widths or diameters ≧60° and <80° a unique position code is generated in which either three or four of the nine reed switches or other position sensors are actuated for each 10° interval. For an effective actuator angular width or diameter of >80° and <100°, a unique position code is generated with a unique combination of either 4 or 5 reed switches actuated for each 10° interval rotational position on the circle. According to the present invention using a small magnet button actuator of lightweight and small dimension, the preferred range of effective actuator width in angular intervals is >40° and <60°. Such a magnet button is described for example in U.S. Pat. No. 4,627,277 for "Magnet Selector or Switch."

While reference is made to the critical and fixed angular relationship between the actuators of the moving element or armature 20 as approximately 140°, it is apparent that the supplementary angle of 220° may also be used resulting in an equivalent unique code merely offset in phase. Thus as used herein and in the claims the specified angular relationship of approximately 140° between the mounted actuators of the moving element or armature is intended to encompass and include the supplementary angle of 220° in which the back angle between the mounted actuators still remains 140°. Thus an angular relationship of 140° on either side of the effective radial arms of the actuators falls within the scope of this feature and dimension of the invention.

Figure 5:
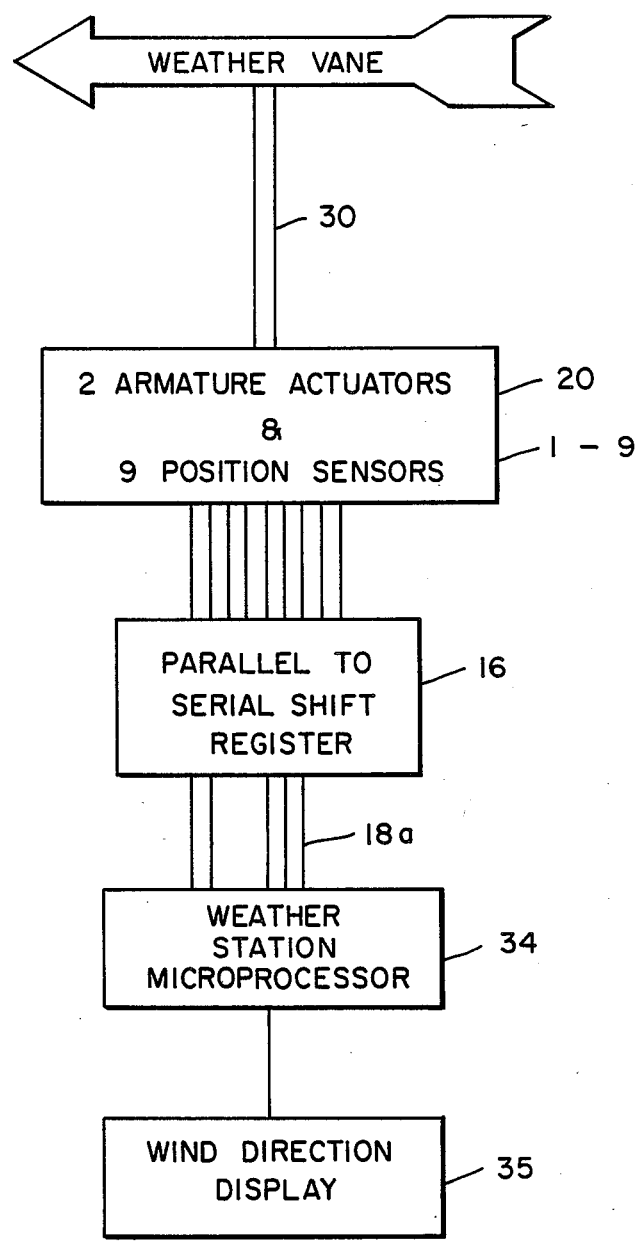
FIG. 5 is a schematic block diagram of the electrical circuit coupling of the absolute rotational position encoder.

A block diagram of the electrical couplings according to the present invention is illustrated in FIG. 5. The rotational shaft for example a weather vane shaft 30 places the two actuators of the armature 20 in a specified angular positioning with reference to the nine position sensors 1-9. The binary on/off indication of each position sensor provides one input to the nine parallel inputs to shift register 16 which in turn provides a unique position code in the form of a serial stream of bits over data line 18a to the weather station or weather center microprocessor 34. The serial stream position code for each interval is specified in the third column of TABLE I. As a result the wind direction is displayed on display 35 in 10° intervals for example in the format set forth in U.S. Pat. No. 4,287,762 for a "Digital Weather Station." In addition to the data line 18a between the parallel to serial shift register 16 and weather center microprocessor 34 other lines include a clock signal line from the microprocessor, a shift load line from the microprocessor, and a pair of power lines, all shown as leads 18a-18e on FIG. 1.

It is apparent that the mechanical function or operation of the stator and armature may be reversed and that the only requirement is one of relative rotation between the two components of the rotational position indicator. For example the position reference or base 12 on which the position sensors are mounted may rotate relative to a stationary actuator 20. In that event, brushes are required to pick up the leads from the moving element for example a five brush slipring. Alternatively both of the elements may be mounted for rotation relative to each other.

The electrical circuitry may of course take a variety of forms. The shift register may be for example a 4021 (generic number) parallel to serial shift register. The clock sampling of the shift register with nine pulses to a cycle may be at desired periodic intervals. For example when wind direction is selected for indication on the microprocessor indicator display, a sampling of the shift register of for example 100 times per second may be used. The microprocessor may be programmed with a look up table in which a desired format of wind direction display is correlated with each of the unique position codes. A variety of position sensors may also be used. In the case of other magnetic sensors for example Hall effect transducers as described in U.S. Pat. No.

4,667,514 for "Parameter Sensors and Monitors" may be used.

Figure 6:
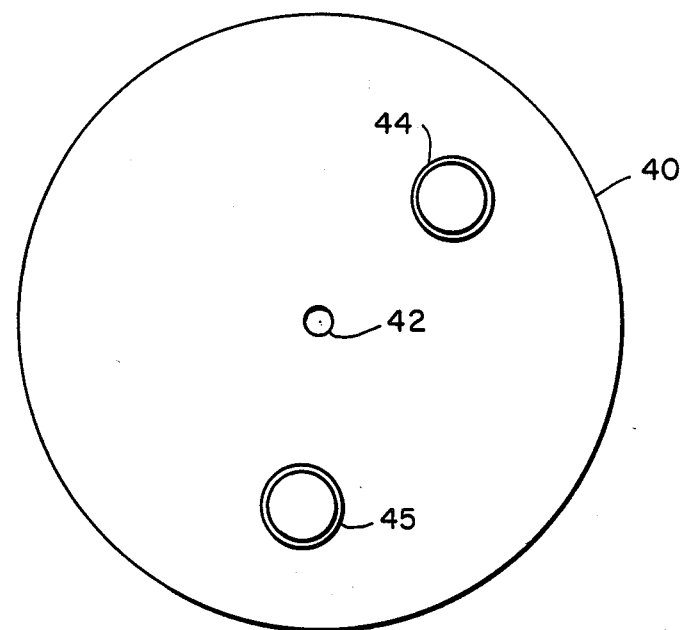
FIG. 6 is a plan view of a disk configuration armature according to the invention.

Another configuration of the armature according to the invention, a disk, circle or ring, is illustrated in FIG. 6. The disk armature 40 is formed with a central axis of rotation 42 and a pair of cups 44 and 45 for retaining the magnets and forming an angle of 140° relative to each other through the axis 42. The retaining cups are at radial positions for actuating the position sensors upon rotation of the disk.

Figure 7:
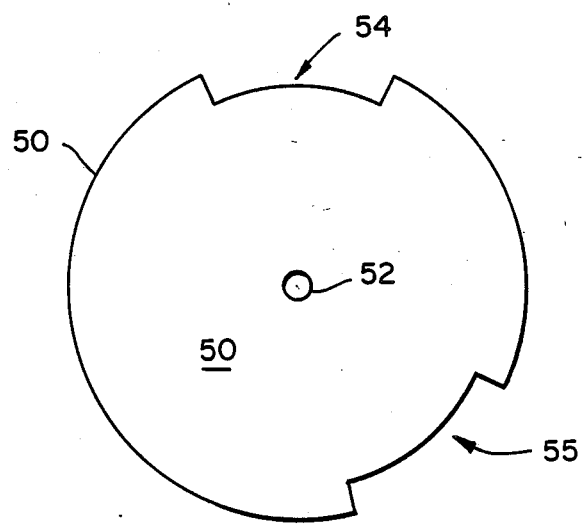
FIG. 7 is a plan view of an optical disk armature for an optical system embodiment according to the invention.

A rotating armature for an optical system embodiment of the invention is illustrated in FIG. 7. The optical disk armature 50 is formed with a center axis of rotation 52 and two open actuator segments 54 and 55 centered at 140° with respect to each other through the center axis. The angular width of each open actuator segment 54 and 55 is approximately 50°.

Figure 8:
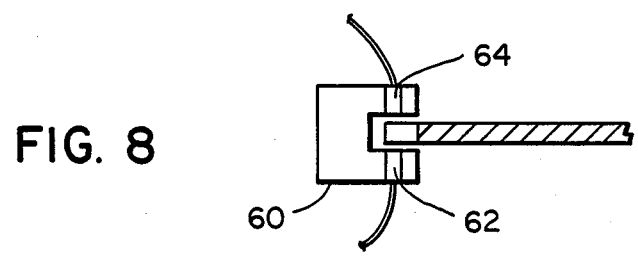
FIG. 8 is a diagrammatic side view of an optical interrupter position sensor for an optical system embodiment of the invention.

In this optical embodiment, the position sensors are optical interrupters 60 as illustrated in FIG. 8. Each optical interrupter position sensor 60 is formed with a light source 62 such as an LED and a photo sensor 64. Light coupling position sensing is enabled by the open actuator segments 54 and 55 of optical disk armature 50. Nine optical interrupter position sensors are equally spaced in a circle on a stator or stationary position reference as described above.

While the invention has been described with reference to particular example embodiments it is intended to encompass all modifications and equivalents within the scope of the following claims.

We claim:

1. A rotational position indicator comprising:
a stator having nine position sensors substantially equally spaced around the circumference of circle;
an armature mounted for rotation on an axis located at the center of the circle, said armature being formed with two position sensor actuating means mounted at approximately 140° relative to each other, each said position sensor actuating means being mounted at a radial position for selectively actuating the position sensors upon rotation of the armature; and
electrical circuit means coupled to each position sensor for indicating actuation or not of the respective position sensor thereby providing unique position codes for successive intervals of angular positioning of the armature relative to the stator.

2. The rotational position indicator of claim 1 wherein the position sensor actuating means are constructed and arranged to have an actuating effect on the position sensors over an angular interval selected to be at least as great as the angular spacing between two adjacent position sensors.

3. The rotational position indicator of claim 2 wherein the position sensor actuating means comprise magnets each constructed and arranged with fringing magnetic fields having an actuating effect on position sensors over a selected angular interval within the specified angular interval range.

4. The rotational position indicator of claim 1 wherein the equal spacing between position sensors is an equal angular spacing of approximately 40° and wherein the actuating means are constructed and arranged to have an actuating effect on position sensors over an angular interval selected to be within an angular interval range at least as great as 40° and less than 60°.

5. The rotational position indicator of claim 4 wherein the position sensor actuating means are magnets constructed and arranged with fringing magnetic fields having an actuating effect on position sensors over a desired angular interval selected to be within the specified angular interval range.

6. The rotational position indicator of claim 1 wherein the position sensor actuating means are magnets each constructed and arranged with fringing magnetic fields having an actuating effect over a selected angular interval which produces 36 unique position codes for identifying successive 10° intervals of angular positioning of the armature relative to the stator.

7. The rotational position indicator of claim 6 wherein the position sensors comprise magnetic reed switches.

8. The rotational position indicator of claim 1 wherein the electrical circuit means comprises a parallel to serial shift register operatively coupled with nine parallel inputs from the nine position sensors and a data line output for delivering unique position codes in a serial stream of bits.

9. The rotational position indicator of claim 8 further comprising a microprocessor for logically processing the unique position codes and display means for displaying an indication of the angular positioning of the armature relative to the stator.

10. The rotational position indicator of claim 1 further comprising a weather vane shaft mounted for rotation on the axis at the center of the circle and wherein said armature is mounted on the weather vane shaft for indicating the rotational wind direction position of a weather vane.

11. The rotational position indicator of claim 10 wherein the electrical circuit means comprises a parallel to serial shift register operatively coupled with nine parallel inputs from the nine position sensors and a data line output for delivering unique position codes in a serial stream of bits, a microprocessor for logically processing the unique position codes and display means for displaying the wind direction.

12. A rotational position indicator comprising:
position sensor means having nine position sensors substantially equally spaced around the circumference of a circle;
actuator means mounted on an axis located at the center of the circle, said actuator means having two position sensor actuators mounted at approximately 140° relative to each other, each said position sensor actuator being mounted at a radial position for selectively actuating the position sensors upon relative rotation of the position sensor means and actuator means with respect to each other;
said position sensor means and said actuator means being mounted for relative rotation with respect to each other around the axis at the center of the circle for selectively actuating the position sensors during relative rotation;
and electrical circuit means coupled to each position sensor for indicating actuation or not of the respective position sensor thereby providing unique position codes for successive intervals of relative angular positioning of the position sensing means and actuator means.

13. The rotational position indicator of claim 12 wherein the actuators are constructed and arranged to have an actuating effect on position sensors over an angular interval at least as great as the angular spacing between two adjacent position sensors.

14. The rotational position indicator of claim 12 wherein the equal spacing between position sensors is an equal angular spacing of approximately 40° and wherein the actuators are constructed and arranged to have an actuating effect on position sensors over an angular interval selected to be within an angular interval range at least as great as 40° and less than 60°.

15. The rotational position indicator of claim 12 wherein the actuators are constructed and arranged to have an actuating effect over a selected angular interval which produces 36 unique position codes for identifying successive 10° intervals of angular positioning of the position sensing means and actuator means relative to each other.

16. The rotational position indicator of claim 12 wherein the actuator means comprises radial arms formed at approximately 140° relative to each other, said position sensor actuators being mounted at radial positions on the respective radial arms.

17. The rotational position indicator of claim 12 wherein the actuator means comprises a disk formed with an axis of rotation positioned at the center of the circle of position sensors, said two position sensor actuators being mounted on the disk approximately 140° relative to each other said axis of rotation.

18. A rotational position wind direction indicator for indicating the rotational position of a weather vane shaft comprising:
 a stator having nine position sensors substantially equally spaced around the circumference of a circle;
 an armature mounted for rotation on an axis located at the center of the circle, said armature being coupled to the weather vane shaft for rotation with the weather vane shaft, said armature being formed with two position sensor actuators mounted at approximately 140° relative to each other; each position sensor actuators being mounted at a radial position for selectively actuating the position sensors upon rotation of the armature, said actuators being constructed and arranged to have an actuating effect on the position sensors over an angular interval selected to be at least as great as the angular spacing between two adjacent position sensors;
 electrical circuit means coupled to each position sensor for indicating actuation or not of the respective position sensor thereby providing unique position codes for successive intervals of angular positioning of the armature relative to the stator, said electrical circuit comprising a parallel to serial shift register operatively coupled with nine parallel inputs from the nine position sensors and a data line output for delivering unique position codes in a serial stream of bits.

19. The rotational position indicator of claim 18 wherein the actuators are constructed and arranged to have an actuating effect over a selected angular interval so that rotation of the armature relative to the stator produces 36 unique position codes for identifying successive 10° intervals of angular positioning of the armature relative to the stator.

20. The rotational position indicator of claim 19 wherein the equal spacing between position sensors is an equal angular spacing of approximately 40° and wherein the actuators are constructed and arranged to have an actuating effect on position sensors over an angular interval selected to be within an angular interval range at least as great as 40° and less than 60°.

* * * * *